ELECTRONIC ASSEMBLY WITH BUTT WELDED AUXILIARY STANDARD LEADS SUPPORTING COMPONENTS

Filed Aug. 11, 1964

INVENTOR.
James H. Flaherty

BY
Warren D. Hill
ATTORNEY 3,275,895

ELECTRONIC ASSEMBLY WITH BUTT WELDED AUXILIARY STANDARD LEADS SUPPORTING COMPONENTS

James H. Flaherty, Hales Corners, Wis., assignor to General Motors Corporation, Detroit, Mich., a corporation of Delaware Filed Aug. 11, 1964, Ser. No. 388,859
2 Claims. (Cl. 317—101)

This invention relates to electronic components and to electronic modules containing such components.

Previously it has been the practice to fabricate electronic modules for aerospace applications wherein welded connections are made between component leads and circuit conductors to provide a very high reliability assembly. One extensively used module of this type is a sandwich construction. Resistors, capacitors, and other components are arranged parallel to each other with their leads extending through apertures in two spaced insulating wafers. The component leads are appropriately interconnected by a mazelike array of nickel ribbons located externally of each wafer and welded to the component leads. Alternatively, the wafers may have printed circuit conductors incorporated thereon with outwardly bent tabs for connection to the components as disclosed in my copending application Serial No. 49,028, filed August 11, 1960, now Patent No. 3,157,828, or the wafers may be printed circuit boards having outwardly extending studs welded to the component leads as disclosed in my copending application Serial No. 388,860, filed August 11, 1964. Each of these structures has a disadvantage in that two wafers or circuit boards are required which add to the size and weight of the module. These are serious disadvantages when the module is to be used for airborne, and especially for missile, applications.

A further disadvantage of the prior art devices is that the components, as received from various suppliers, have nonuniform leads; that is, the leads vary in both composition and diameter. This causes difficulty in welding the leads to the circuit connections since the welding current and electrode pressure must be adjusted to suit the size and composition of each component lead. Another disadvantage resides in the difficulty in inserting a myriad of component leads through the apertures in the second wafer board after they have already been inserted in the first wafer. In addition, the operation of inserting the leads into the apertures of the second wafer board may occasion bending of the leads thereby placing physical stress on the component envelopes.

It is an object of this invention to overcome these disadvantages by attaching new leads of standard size and composition to the original leads whereby all welds may be made at the same current and pressure.

It is a further object of this invention to provide an improved electronic assembly by providing each component with auxiliary leads extending in the same direction in order that they can extend through apertures in a single wafer or circuit board.

A further object of my invention is to provide a component structure wherein the component may be inserted from one side, hence facilitating the assembly of components to the wafers or circuit boards and eliminating the need for bending the component leads.

The above and other advantages will be made more apparent from the following specification taken in conjunction with the accompanying drawing wherein like reference numerals refer to like parts, and wherein.

Figure 1:
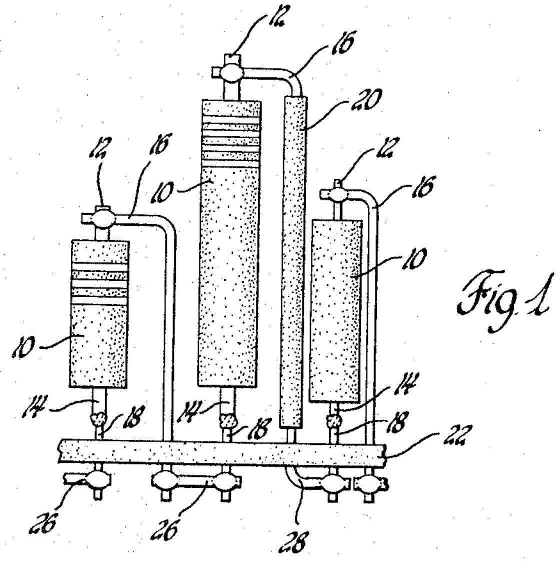
FIGURE 1 is a partial elevational view of an electronic module according to my invention.

In FIGURE 1, each of the resistors 10 comprises a conventional resistor having its leads extending axially therefrom in opposite directions which leads are cut off leaving only stubs 12 and 14. An L-shaped length of standard lead wire 16 has its foot portion welded to the stub 12 with the leg portion extending alongside the body of the resistor 10 and parallel thereto. A short length of standard lead wire 18 is butt welded to the stub 14 to extend parallel to the leg of lead 16. By "standard lead wire" is meant a wire of any given diameter and composition, preferably nickel or nickel alloy. The process of cutting off the component leads and welding the standard leads 16 and 18 to the stubs 12 and 14 is readily carried out by automatic machinery. For each type of component lead a suitable welding pressure and current must be selected; however, once this is done several hundred or several thousand components may have standard leads welded thereto without further adjustment of the welding machine.

Where necessary to prevent short circuits, a jacket 20 of plastic or other insulating material may be placed over the lead wire 16. Of course, the lower portion of the wire 16 must be left bare to permit its insertion through an aperture in the insulating wafer 22. The wafer 22 is a support member for the components and has a pattern of predrilled holes according to the desired arrangement of components on the wafer. To assemble the components to the wafer, it is necessary only to align both leads of each component with the holes prepared therefor and to insert the leads. Then the circuit connections are made to the tips of the leads extending through the wafer to complete the assembly. If desired, of course, the module may be encapsulated in some suitable insulating material such as epoxy or a plastic foam. The circuit components 10 as shown in FIGURE 1 are interconnected by means of a wire or ribbon 26. In addition, the lower tip 28 of a standard lead may be bent into contact with a neighboring lead with which a direct connection is desired. The welding of all the connections is carried out by a single combination of welding current and pressure since the leads to be welded to the ribbon are uniform throughout the assembly.

Figure 2:
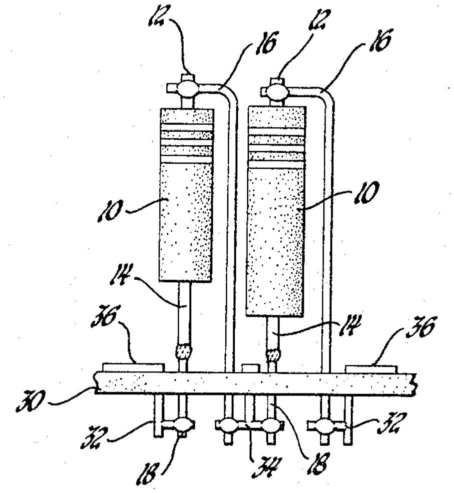
FIGURE 2 is a partial elevational view of an electronic module according to another embodiment of my invention.

The module structure illustrated in FIGURE 2 is similar to that of FIGURE 1 except that the wafer 22 and ribbon conductors 26 are replaced by a printed circuit board 30 having terminal studs 32, 34 welded to the circuit conductors 36. The studs are shown to have Y-shaped heads as at 32 or a T-shaped head as at 34. This form of welded stud circuit board is further described in the above noted application Serial No. 388,860.

Figure 3:
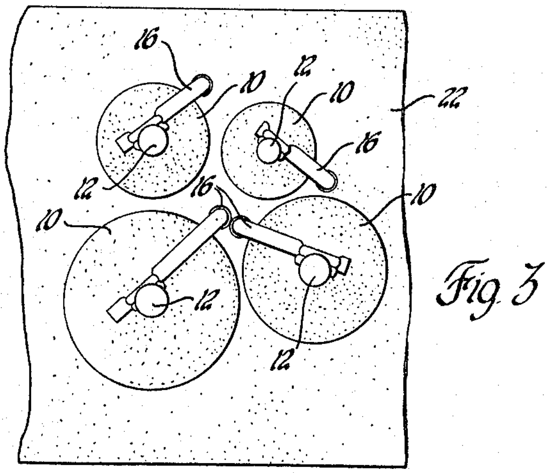
FIGURE 3 is a partial plan view of an electronic module according to my invention.

FIGURE 3 serves to illustrate that very high component density may be achieved using applicant's invention in that, even though the cylindrical components 10 are touching each other, or nearly so, ample room between the components remains to allow the vertical leg of lead 16 to extend down through the wafer 22.

It will thus be seen that my invention makes possible a high component density electronic module superior to those previously known and that the components with the standard leads are easily inserted through the wafer board. Moreover, a second wafer board is eliminated thereby reducing the size of the module by not only the thickness and weight of the second wafer board but also by the dimensions of the second layer of circuit connections and assembly clearances associated with a second wafer. It will also be seen that by providing leads of standard composition and diameter a single setting of the welding machine is adequate to complete all circuit connections thereby eliminating the chance of human error which is present when welding various connections requiring different welding machine settings.

It is to be understood that this description is illustrative of the preferred embodiment and the scope of the invention is intended to be limited only by the following claims.

I claim:

1. An electronic assembly including a group of substantially cylindrical components each having leads extending axially therefrom in opposite directions, auxiliary leads welded to the first mentioned leads formed to extend in the same direction parallel to the axis of the component, at least one of the auxiliary leads for each component being butt welded to its corresponding first mentioned lead, an apertured support member, the free ends of the auxiliary leads extending through the apertured member to support and locate the components, and electrical conductor members welded to the auxiliary leads to form an electronic assembly, the auxiliary leads all being of the same diameter and composition to facilitate welding thereof to said conductor members.

2. An electronic assembly comprising a group of components each having leads extending therefrom in opposite directions, auxiliary leads welded to the first mentioned leads formed to extend in the same direction, at least one of the auxiliary leads for each component being butt welded to its corresponding first mentioned lead, an apertured support member, the free ends of the auxiliary leads extending through the apertured member to support and locate the components and electrical conductor members interconnecting the auxiliary leads to form an electronic assembly, the auxiliary leads all being of the same diameter and composition to facilitate welding thereof to said conductor members.

References Cited by the Examiner

UNITED STATES PATENTS

| | | | |
|---|---|---|---|
| 2,244,009 | 6/1941 | Hiensch et al. | 317—101 X |
| 3,150,288 | 9/1964 | Flanders et al. | 174—52.6 X |
| 3,202,755 | 8/1965 | Oswald | 317—101 |

ROBERT K. SCHAEFER, *Primary Examiner.*

KATHLEEN H. CLAFFY, *Examiner.*

J. J. BOSCO, *Assistant Examiner.*